United States Patent
Lester et al.

(10) Patent No.: US 8,637,891 B2
(45) Date of Patent: Jan. 28, 2014

(54) LIGHT-EMITTING DEVICE WITH IMPROVED ELECTRODE STRUCTURES

(75) Inventors: Steven D. Lester, Palto, CA (US); Chao-Kun Lin, San Jose, CA (US)

(73) Assignee: Toshiba Techno Center Inc., Tokyo (JP)

( * ) Notice: Subject to any disclaimer, the term of this patent is extended or adjusted under 35 U.S.C. 154(b) by 0 days.

(21) Appl. No.: 12/472,809

(22) Filed: May 27, 2009

(65) Prior Publication Data
US 2010/0059765 A1 Mar. 11, 2010

(30) Foreign Application Priority Data

Sep. 9, 2008 (TW) ................................ 97134499 A
Sep. 16, 2008 (TW) ................................ 97135436 A

(51) Int. Cl.
*H01L 33/38* (2010.01)

(52) U.S. Cl.
USPC .................... 257/99; 257/79; 257/81; 257/91

(58) Field of Classification Search
USPC ......................................... 257/79, 81, 91, 99
See application file for complete search history.

(56) References Cited

U.S. PATENT DOCUMENTS

| | | | |
|---|---|---|---|
| 6,307,218 B1 | 10/2001 | Steigerwald et al. | |
| 6,614,056 B1 | 9/2003 | Tarsa et al. | |
| 6,650,018 B1 * | 11/2003 | Zhao et al. | 257/775 |
| 6,885,036 B2 * | 4/2005 | Tarsa et al. | 257/99 |
| 6,885,038 B2 | 4/2005 | Tarsa et al. | |
| 2004/0012958 A1 | 1/2004 | Hashimoto et al. | |
| 2004/0140473 A1 * | 7/2004 | Chen | 257/79 |
| 2006/0220041 A1 | 10/2006 | Peterson | |

FOREIGN PATENT DOCUMENTS

| | | | | |
|---|---|---|---|---|
| EP | 1482566 A2 | 12/2004 | | |
| JP | 09129921 | 5/1997 | | |
| JP | 09129921 A | * 5/1997 | ............. | H01L 33/00 |
| JP | 2002319704 | 10/2002 | | |
| JP | 2008091942 | 4/2008 | | |
| TW | 200849652 | 12/2008 | | |
| TW | I375334 B | 12/2008 | | |

OTHER PUBLICATIONS

Office Action dated Feb. 5, 2013, Chinese Patent Office, corresponding to present application in US.
Office Action dated Mar. 5, 2012, Chinese Patent Office, corresponding to present application in US.
European Search Report dated Jun. 11, 2013, corresponding to European Application No. 09 16 7503.

* cited by examiner

*Primary Examiner* — Ha Tran T Nguyen
*Assistant Examiner* — Raj R Gupta
(74) *Attorney, Agent, or Firm* — Hogan Lovells US LLP

(57) ABSTRACT

A light-emitting device includes first and second semiconductor layers and a light-emitting layer between the first and second semiconductor layers. The light-emitting device also includes an improved electrode structures.

17 Claims, 8 Drawing Sheets

LIGHT-EMITTING DEVICE WITH IMPROVED ELECTRODE STRUCTURES

BACKGROUND

1. Field

The present disclosure relates to light emitting devices, and more particularly, to light emitting devices with improved electrode structures. Various configurations of electrode structures together with a relatively thin transparent conductive oxide layer may increase light extraction and lower operation voltage for a light-emitting device.

2. Background

Light-emitting diodes (LEDs), which convert electric current to light, are one of the most important solid-state light-emitting devices nowadays. An LED generally includes a light-emitting layer located between a P-type semiconductor layer and an N-type semiconductor layer. The driving current is applied to a P-type electrical contact, which is electrically connected to the P-type semiconductor layer, and to an N-type electrical contact, which is electrically connected to the N-type semiconductor layer. The P-type semiconductor layer and the N-type semiconductor layer thus eject holes and electrons respectively to the light-emitting layer. The holes and electrons combine within the light-emitting layer and emit light accordingly. The light is emitted in all directions from the light-emitting layer and then leaves the surfaces of the LED.

Increasing the size and the light-emitting area of an LED is one of the methods to enhance its luminous efficiency and luminous intensity. For a conventional nitride-based LED, however, increasing its size may be subject to limitations since electric current cannot be spread uniformly from the electrical contact across the entire light-emitting layer. For instance, because a P-type nitride-based semiconductor layer has relatively low conductivity, the spread of electric current applied to the P-type electrical contact may be limited to a certain area of the P-type nitride-based semiconductor layer, below the P-type electrical contact. The current cannot be spread laterally across the entire P-type nitride-based semiconductor layer. Moreover, heat may be generated at certain parts of the LED, causing the material of the components around the electrical contact to deteriorate more quickly. As for the N-type nitride-based semiconductor layer, though it has better conductivity, there is still some resistance for the current to spread laterally across the layer. As the size of the LED device increases, electric current cannot be spread as uniformly from the electrical contact across the N-type nitride-based semiconductor layer. Therefore, the size of a conventional nitride-based LED is limited by the lateral spread of electric current in the P-type nitride-based semiconductor layer and in the N-type nitride-based semiconductor layer.

SUMMARY

In one aspect of the disclosure, a light-emitting device includes first and second semiconductor layers, a light-emitting layer between the first and second semiconductor layers, a first electrode pattern layer on the first semiconductor layer, and a second electrode pattern layer on the second semiconductor layer, wherein the second electrode pattern layer includes an electrode body and a plurality of branched electrodes extending from the electrode body toward the first electrode pattern layer.

In another aspect of the disclosure, a light-emitting device includes first and second semiconductor layers, a light-emitting layer between the first and second semiconductor layers, a first electrode pattern layer on the first semiconductor layer, and a second electrode pattern layer on the second semiconductor layer, wherein the first and second electrode pattern layers are arranged such that there is a non-uniform distance between the first and second electrode pattern layers along a length of die first and second electrode pattern layers.

It is understood that other aspects of the present invention will become readily apparent to those skilled in the art from the following detailed description, wherein it is shown and described only exemplary configurations of a light-emitting device by way of illustration. As will be realized, the present invention includes other and different aspects of a light-emitting device and its several details are capable of modification in various other respects, all without departing from the spirit and scope of the present invention. Accordingly, the drawings and the detailed description are to be regarded as illustrative in nature and not as restrictive.

BRIEF DESCRIPTION OF THE FIGURES

Various aspects of the present invention are illustrated by way of example, and not by way of limitation, in the accompanying drawings, wherein.

DETAILED DESCRIPTION

Figure 1:
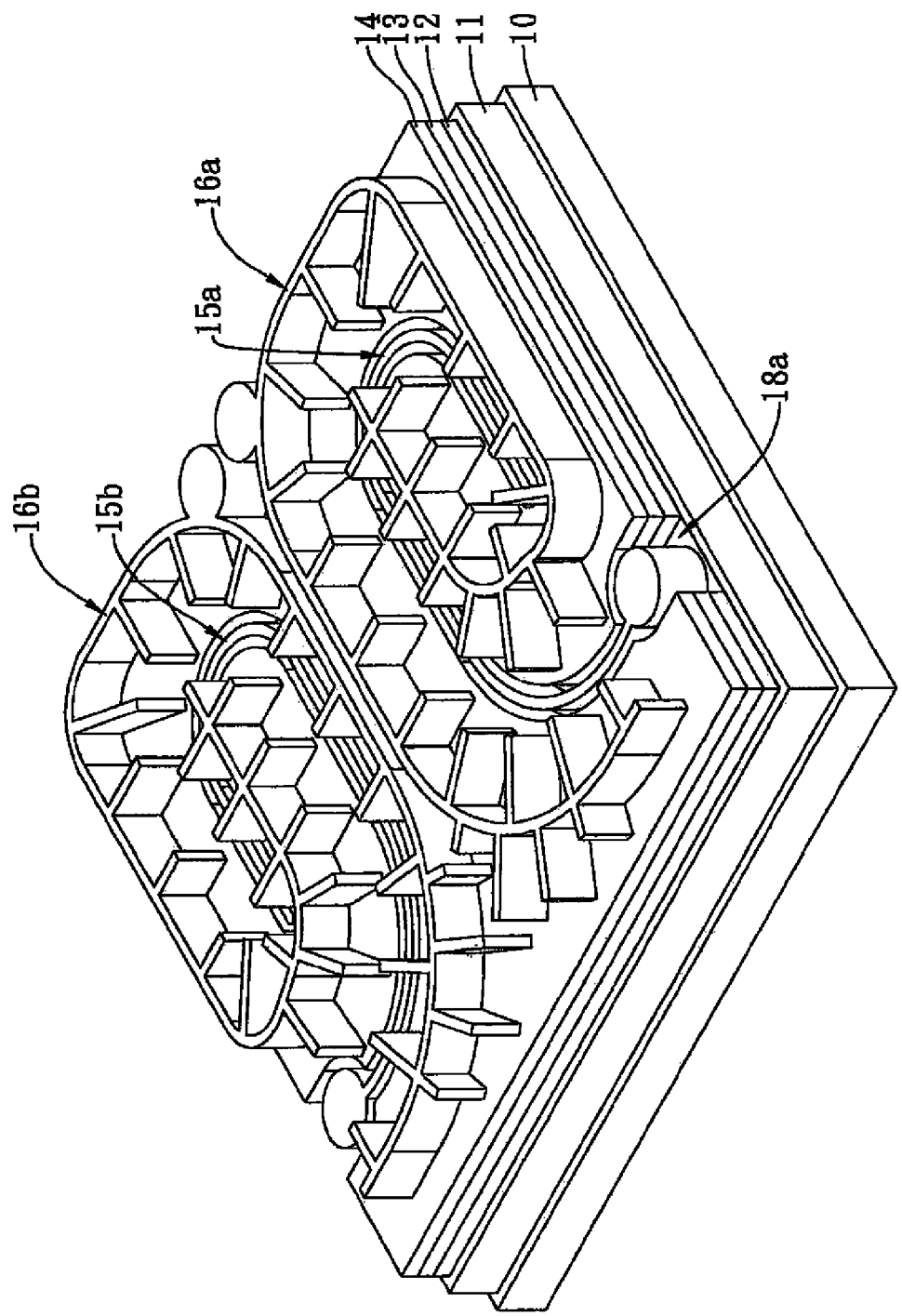
FIG. 1 is a schematic perspective view of a light-emitting device with improved electrode structures.

The present invention is described more fully hereinafter with reference to the accompanying drawings, in which various aspects of the present invention are shown. This invention, however, may be embodied in many different forms and should not be construed as limited to the various aspects of the present invention presented throughout this disclosure. Rather, these aspects are provided so that this disclosure will be thorough and complete, and will fully convey the scope of the present invention to those skilled in the art. The various aspects of the invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, bulb shapes, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower", can therefore, encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various aspects of a light-emitting device with improved electrode structures will now be presented. However, as those skilled in the art will readily appreciate, these aspects may be extended to other light sources without departing from the invention. The light-emitting device may be formed with improved electrode structures that contain particular configurations of a P-type electrode pattern layer and an N-type electrode pattern layer, wherein there is a highly non-uniform distance between the two layers. By utilizing such configurations of electrode structures, together with a relatively thin transparent conductive oxide layer as a current spreading layer, the light-emitting device allows a lower operation voltage and achieves better light extraction.

Figure 2:
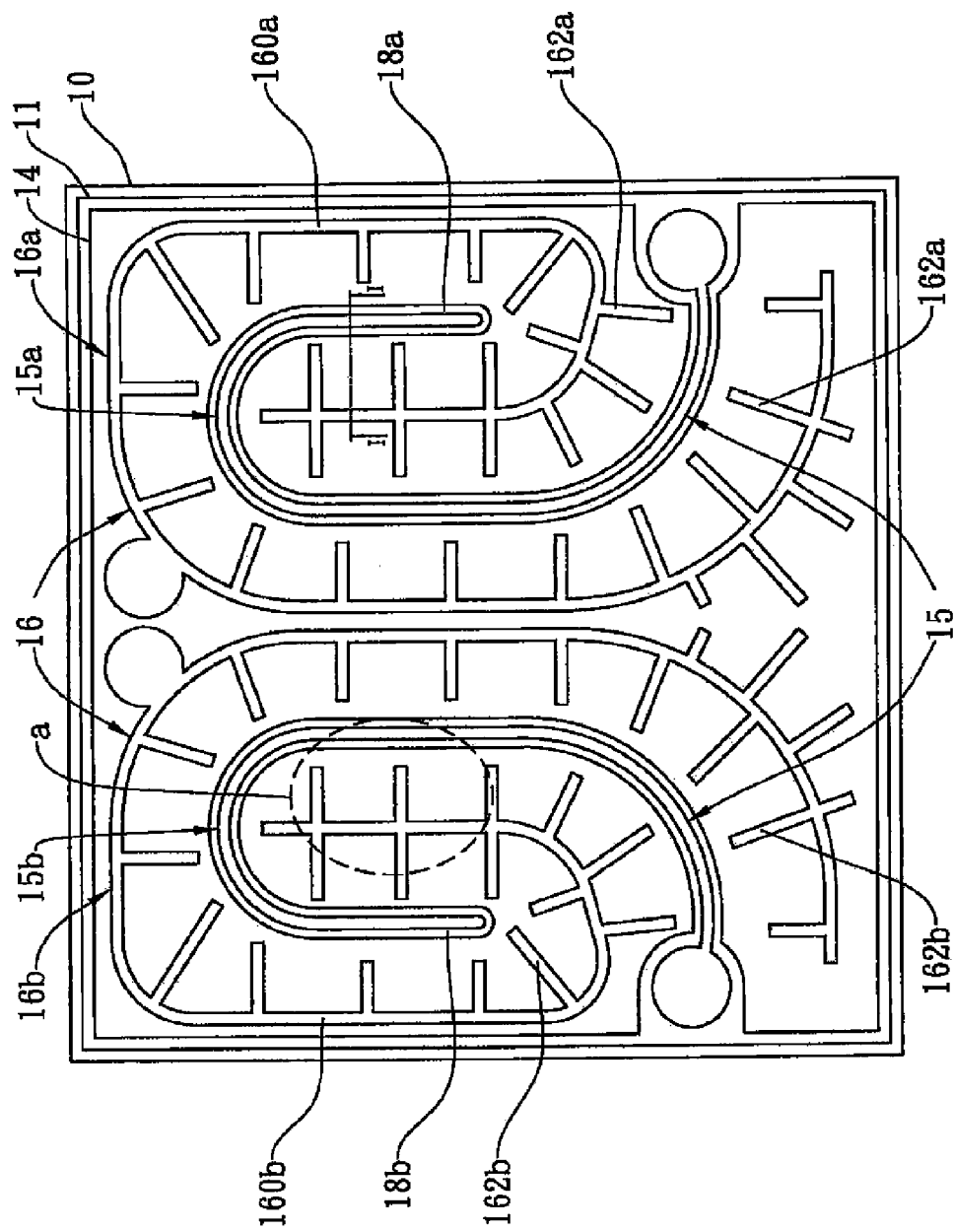
FIG. 2 is a schematic top view of the light-emitting device of FIG. 1.
Figure 2A:
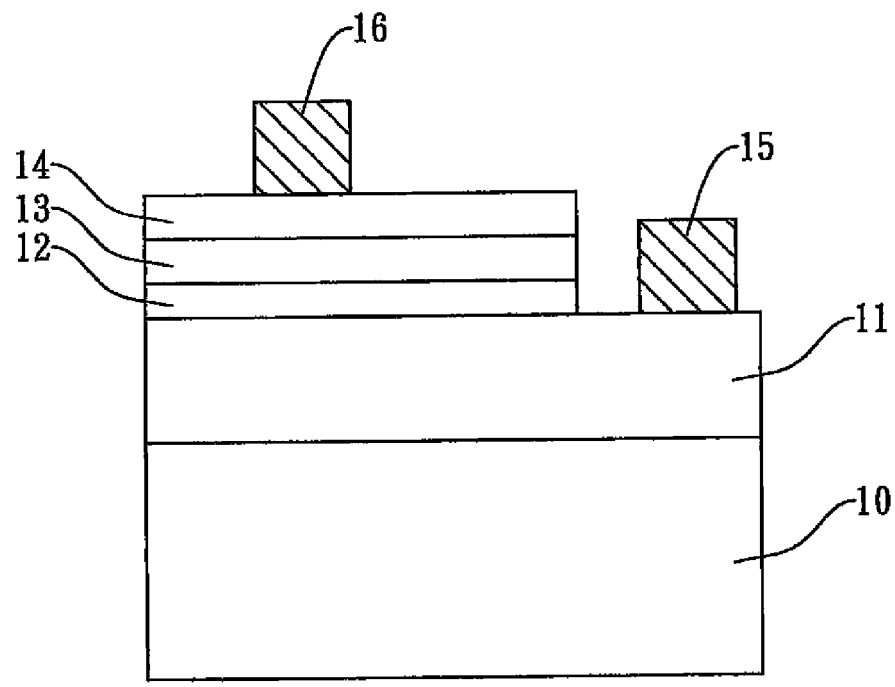
FIG. 2A is a cross-sectional view of a partial structure of the light-emitting device, taken along line I-I of FIG. 2.

FIG. 1 is a schematic perspective view of a light-emitting device with improved electrode structures, while FIG. 2 is a schematic top view of the same. FIG. 2A is a cross-sectional view of a partial structure of the light-emitting device, taken along line I-I of FIG. 2. Referring to the above three illustrations, the light-emitting device comprises a substrate 10, an N-type semiconductor layer 11, a light-emitting layer 12, a P-type semiconductor layer 13, a transparent conductive oxide layer 14 of a thickness smaller than 1000 Angstroms, an N-type electrode pattern layer 15, and a P-type electrode pattern layer 16. The N-type semiconductor layer 11 is formed on the substrate 10. The light-emitting layer 12 is formed on the N-type semiconductor layer 11. The P-type semiconductor layer 13 is formed on the light-emitting layer 12. The transparent conductive oxide layer 14 of a thickness smaller than 1000 Angstroms is formed on the P-type semiconductor layer 13. The transparent conductive oxide layer 14, preferably an ITO (InSnOx) layer, is used as a current spreading layer.

The N-type electrode pattern layer 15 includes a pair of N-type sub-electrode patterns 15*a* and 15*b* in a mirror relationship. In a first embodiment, the N-type sub-electrode pattern 15*a* is a sub-electrode body with an elongated distorted C-shape, while the N-type sub-electrode pattern 15*b* is a reverse sub-electrode body with an elongated distorted C-shape. By etching the transparent conductive oxide layer 14, the P-type semiconductor layer 13 and the light-emitting layer 12 in order, trenches 18*a* and 18*b* having respectively the outlines of the N-type sub-electrode patterns 15*a* and 15*b* may be formed across the transparent conductive oxide layer 14, the P-type semiconductor layer 13 and the light-emitting layer 12, leaving a partial surface of the N-type semiconductor layer 11. Then, the N-type sub-electrode patterns 15*a* and 15*b* are formed within the trenches 18*a* and 18*b*, respectively, upon part of the exposed surface of the N-type semiconductor layer 11, so that electrical contact is formed between the N-type sub-electrode patterns 15*a*, 15*b* and the N-type semiconductor layer 11. There is some space between the N-type sub-electrode patterns 15*a*, 15*b* and the trenches 18*a*, 18*b*, respectively, to prevent electrical contact between the N-type sub-electrode patterns 15*a*, 15*b* and the transparent conductive oxide layer 14, the P-type semiconductor layer 13, the light-emitting layer 12.

The P-type electrode pattern layer 16 includes a pair of P-type sub-electrode patterns 16*a* and 16*b* formed in a mirror relationship on the transparent conductive oxide layer 14. The P-type sub-electrode pattern 16*a* includes a P-type sub-electrode body 160*a* and a plurality of P-type branched electrodes 162*a*. The P-type sub-electrode body 160*a* extends out from the half-enclosed opening of the N-type sub-electrode pattern 15*a*, along the outline of the N-type sub-electrode pattern 15*a* to surround it, such that the configurations of the P-type sub-electrode body 160*a* and the N-type sub-electrode body match with each other. The P-type branched electrodes 162*a* are formed at various positions along the length of the P-type sub-electrode body 160a and extend toward the N-type sub-electrode pattern 15a. Because of the configuration design of the P-type branched electrodes 162a, there will be different distances between various parts at the P-type sub-electrode pattern 16a and their corresponding parts at the N-type sub-electrode pattern 15a. In short, by forming the plurality of the P-type branched electrodes 162a that extend toward the N-type sub-electrode pattern 15a at various positions of the P-type sub-electrode pattern 16a, there is a highly non-uniform distance between the P-type sub-electrode pattern 16a and the N-type sub-electrode pattern 15a.

Likewise, the P-type sub-electrode pattern 16b includes a P-type sub-electrode body 160b and a plurality of P-type branched electrodes 162b. The P-type sub-electrode body 160b extends out from the half-enclosed opening of the N-type sub-electrode pattern 15b, along the outline of the N-type sub-electrode pattern 15b to surround it. The P-type branched electrodes 162b are formed at various positions along the length of the P-type sub-electrode body 160b and extend toward the N-type sub-electrode pattern 15b. Because of the configuration design of the P-type branched electrodes 162b, there will be different distances between various parts at the P-type sub-electrode pattern 16b and their corresponding parts at the N-type sub-electrode pattern 15b. In other words, there is a highly non-uniform distance between the P-type sub-electrode pattern 16b and the N-type sub-electrode pattern 15b.

By utilizing the particular configurations of the N-type electrode pattern layer 15 and the P-type electrode pattern layer 16, which lead to a highly non-uniform distance between the two pattern layers, together with a relatively thin transparent conductive oxide layer 14, such as an ITO layer of a thickness smaller than 1000 Angstroms (preferably an ITO layer having a thickness of 600 Angstroms) formed underneath the P-type electrode pattern layer 16, the light-emitting device may achieve better light extraction and allows a lower operation voltage. That is to say, the improved electrode structures, combined with a relatively thin transparent conductive oxide layer, can increase luminous efficiency of the light-emitting device.

In the first embodiment, the N-type electrode pattern layer 15 and the P-type electrode pattern layer 16 are preferably made of of metal to increase the conductivity, and still more preferably, made of reflective metal having a reflectivity greater than 60%, such as Al or Ag.

Figure 2B:
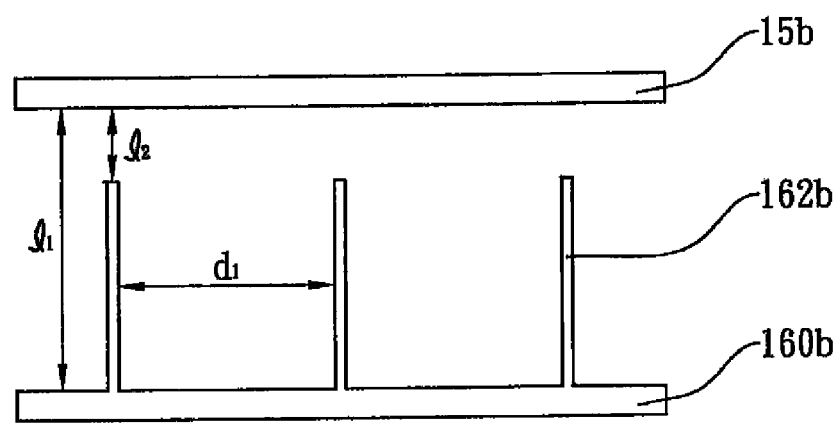
FIG. 2B is a schematic top view showing the relationship between a partial structure of the N-type sub-electrode pattern and a partial structure of the P-type sub-electrode pattern in area a of FIG. 2.

To achieve a highly non-uniform distance between the N-type electrode pattern layer 15 and the P-type electrode pattern layer 16, the P-type sub-electrode bodies 160a, 160b of the P-type sub-electrode patterns 16a, 16b and the P-type branched electrodes 162a, 162b thereon can have various configuration designs. FIG. 2B is a schematic top view showing the relationship between a partial structure of the N-type sub-electrode pattern 15b and a partial structure of the P-type sub-electrode pattern 16b in area a of FIG. 2. The P-type sub-electrode body 160b and the P-type branched electrodes 162b in FIG. 2B show a comb configuration, with each P-type branched electrode 162b forming a straight line. Each of the P-type sub-electrode bodies 16a, 16b and each of the N-type sub-electrode patterns 15a, 15b may have an electrode width w smaller than 30 μm (e.g. 5-10 μm). Each N-type electrode pattern layer 15 and each P-type electrode pattern layer 16 may have an electrode thickness t, wherein t>10/w (e.g., t can be 4 μm). The distance $l_1$ between the P-type sub-electrode body 160b and the N-type sub-electrode pattern 15b may be around 125 μm, and the distance between the P-type branched electrode 162b and the N-type sub-electrode pattern 15b may be $l_2$, wherein $0<l_2<l_1/2$. In this embodiment, the distance between the P-type branched electrode 162b and the N-type sub-electrode pattern 15b can have a range of $0<l_2<62.5$ μm. The distance $d_1$ between each pair of P-type branched electrodes 162b may be smaller than twice of the $l_1$ (e.g. around 110 μm).

Figure 2C:
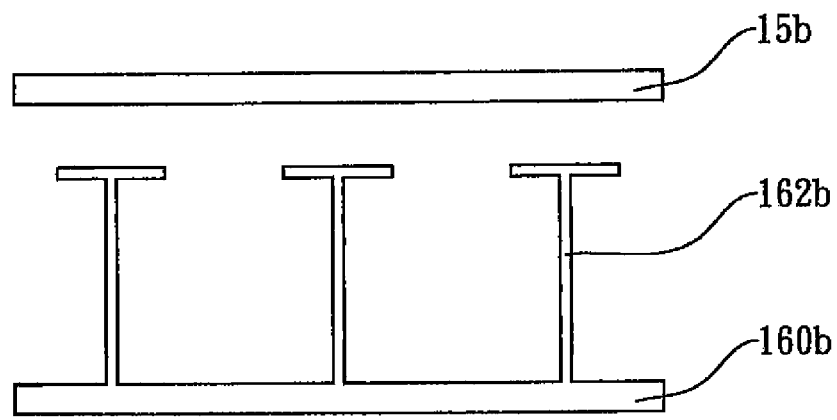
FIG. 2C is a schematic top view showing an alternative configuration of the structures shown in FIG. 2B.
Figure 2D:
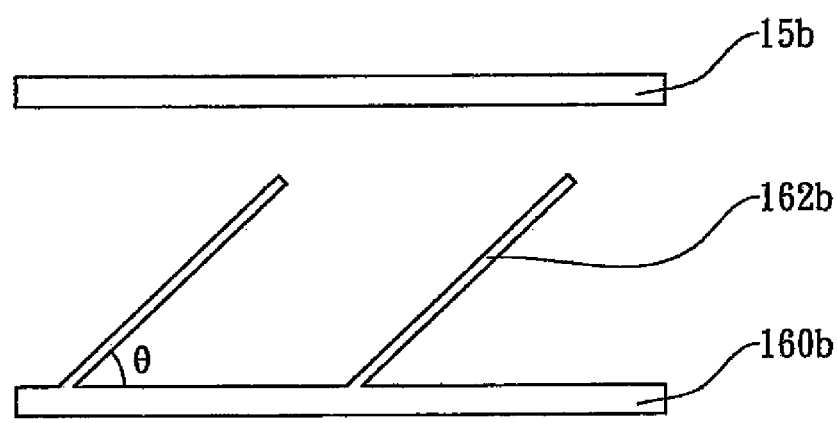
FIG. 2D is a schematic top view showing another alternative configuration of the structures shown in FIG. 2B.
Figure 2E:
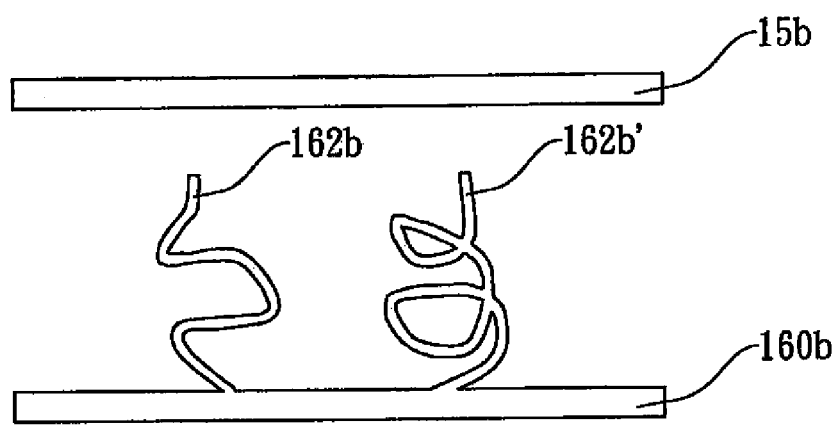
FIG. 2E is a schematic top view showing yet another alternative configuration of the structures shown in FIG. 2B.
Figure 2F:
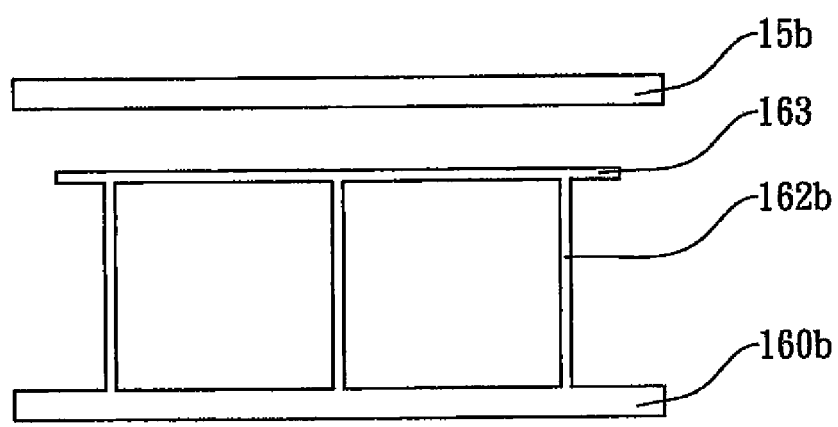
FIG. 2F is a schematic top view showing still yet another alternative configuration of the structures shown in FIG. 2B.

In the example illustrated in FIG. 2B, there is a constant length for each of the P-type branched electrodes 162b, however, the length can also vary among them. FIG. 2C to FIG. 2F show alternative electrode structures, but it should be noted that alternative electrode structures that come within the scope of the invention are not limited hereto. FIG. 2C shows that each P-type branched electrode 162b has a T-shape. In FIG. 2D, the P-type sub-electrode body 160b and the P-type branched electrodes 162b show a fish bone configuration with each P-type branched electrode 162b forming a slanted straight line. Preferably, the angle formed between the P-type sub-electrode body 106b and the P-type branched electrodes is between 45° and 135°. FIG. 2E shows that each P-type branched electrode can have a curvilinear shape like P-type branched electrode 162b, or a multiple-curvilinear shape like P-type branched electrode 162b. In FIG. 2F, the P-type sub-electrode body 160b and the P-type branched electrodes 162b show a guard rail configuration. The P-type branched electrodes 162b are connected by a P-type common electrode 163 at the end opposite to the P-type sub-electrode body 160b. The electrode dimensions in FIG. 2B can be applied to FIGS. 2C to 2F as well. It should be noted the various electrode configuration presented in connection with FIGS. 2A-2F are merely non-limiting examples and that other electrode structure configurations are encompassed within the scope of the invention. The actual configuration of the P-type branched electrode for any particular application may have various shapes composed of straight and/or curvilinear portions. Those skilled in the art will readily be able to determine the appropriate electrode configuration based on the teachings herein for any particular application.

Figure 3:
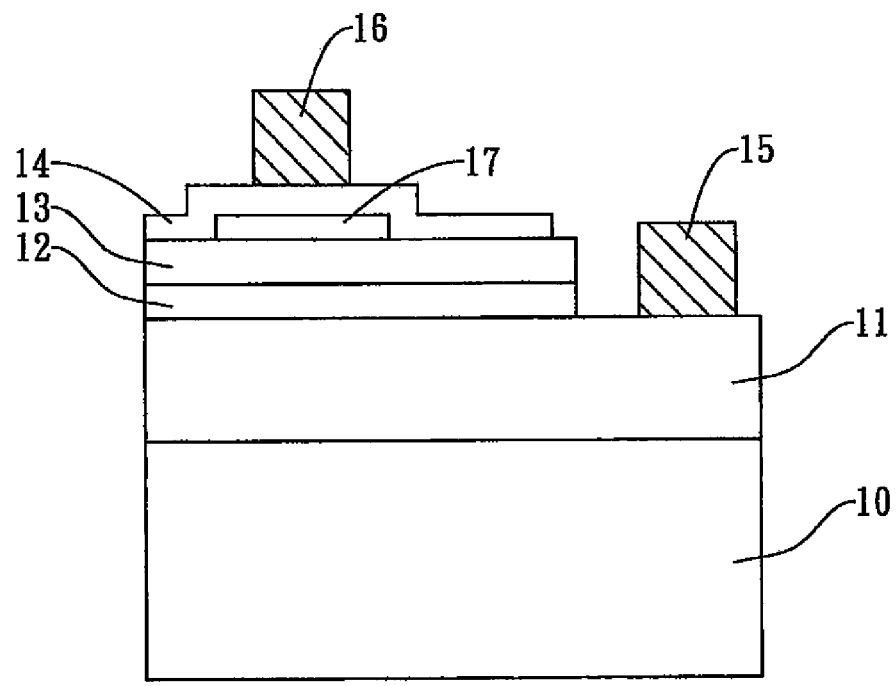
FIG. 3 is a corresponding illustration of FIG. 2A showing a cross-sectional view of the partial structure of a second embodiment of the light-emitting device.

Alternatively, a dielectric layer, which has the same shape as the P-type electrode pattern layer 16, but covers a larger area, can be formed. The dielectric layer may be formed between the transparent conductive oxide layer 14 and the P-type semiconductor layer 13 to prevent the flow of electric current from the P-type electrode pattern layer 16 downward to the light-emitting layer 12, and further, to prevent the light emitted from the light-emitting layer 12 from being absorbed by the P-type electrode pattern layer 16. In other words, a current blocking layer can be formed below the P-type electrode pattern layer 16 in order to prevent part of the light emitted by the light-emitting device from being absorbed by the P-type electrode pattern layer 16. FIG. 3 is a corresponding illustration of FIG. 2A, showing a sectional view of a partial structure of a second embodiment of a light-emitting device. The only difference between the first and second embodiments is that a dielectric layer 17 is formed in the second embodiment. The dielectric layer 17 may be formed between the transparent conductive oxide layer 14 and the P-type semiconductor layer 13, right below the position of the P-type electrode pattern layer 16. Except for the dielectric layer 17, all the components in the second embodiment are the same with those in the first embodiment.

Figure 4:
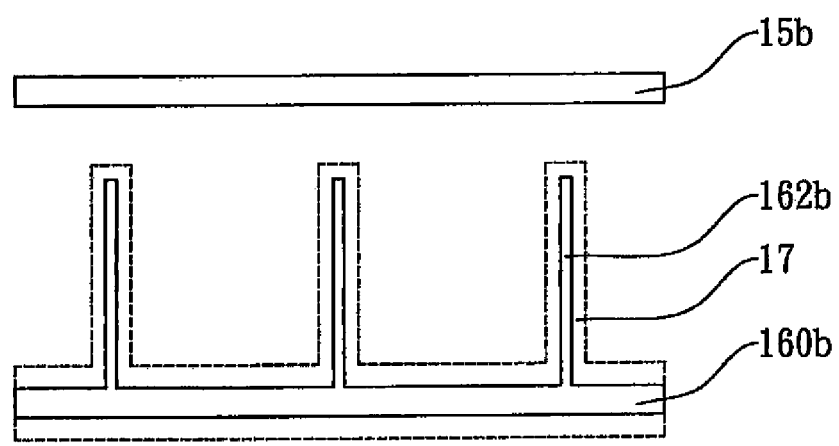
FIG. 4 is a corresponding illustration of FIG. 2B, showing a schematic top view of the second embodiment of the light-emitting device.

Various configurations of the P-type sub-electrode patterns 16a and 16b, namely the P-type sub-electrode bodies 160a, 160b and the P-type branched electrodes 162a, 162b thereupon, as illustrated in FIGS. 2B to 2F, may be applied to the second embodiment as well. FIG. 4 is a schematic top view showing the relationship between a partial structure of the N-type sub-electrode pattern 15b and a partial structure of the P-type sub-electrode pattern 16b in the second embodiment (see also FIG. 2B). The dielectric layer 17 of the second embodiment includes a pair of sub-dielectric layers formed right below the P-type sub-electrode patterns 16a, 16b, between the transparent conductive oxide layer 14 and the P-type semiconductor layer 13. As shown in FIG. 4, each sub-dielectric layer has the same shape as the corresponding P-type sub-electrode pattern, but covers a larger area. In the second embodiment, the dielectric layer 17 is used as a current blocking layer of the light-emitting device, which prevents part of the light emitted by the light-emitting device from being absorbed by the P-type electrode pattern layer 16.

Figure 5:
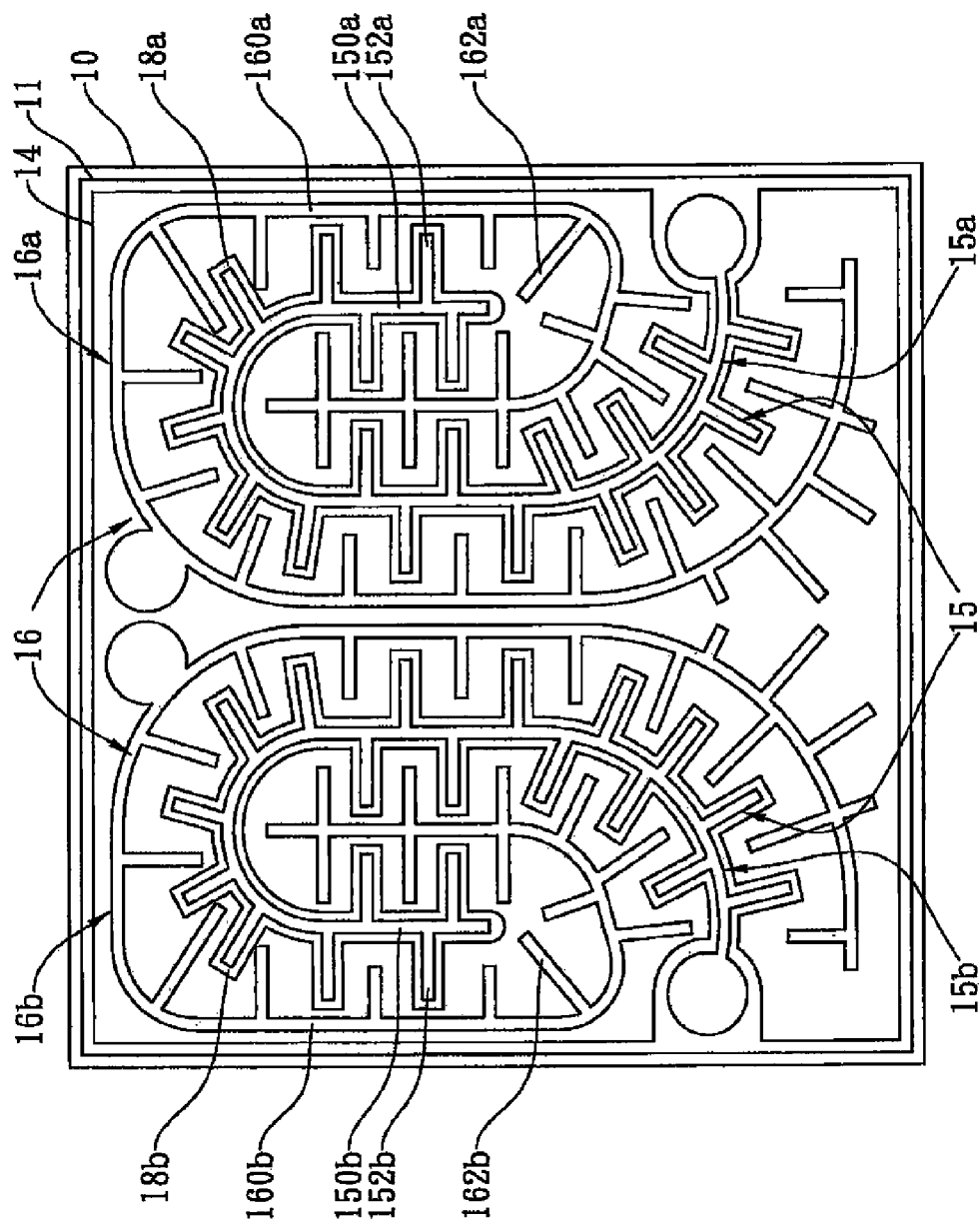
FIG. 5 is a schematic top view of a third embodiment of a light-emitting device.

In a third embodiment of a light-emitting device, the N-type sub-electrode pattern 15 may be designed to have a plurality of branched electrodes as well FIG. 5 is a schematic top view of the light-emitting device illustrating the third embodiment. The third embodiment is different from the first (see FIG. 2) in that the N-type electrode pattern layer 15 in the third embodiment is also designed to have a plurality of branched electrodes. Specifically, the P-type electrode pattern layer 16 in the third embodiment has the same configuration with that in the first embodiment. The N-type sub-electrode pattern 15a of the N-type electrode pattern layer 15 in the third embodiment, however, includes an N-type sub-electrode body 150a and a plurality of N-type branched electrodes 152a formed at various positions along the length of the N-type sub-electrode body 150a and extending toward the opposite P-type sub-electrode pattern 16a. The N-type branched electrodes 152a and the P-type branched electrodes 162a show a regular interdigitated relationship. That is, one N-type branched electrode 152a is alternated with one P-type branched electrode 162a. In an alternative embodiment, however, the N-type branched electrodes 152a and the P-type branched electrodes 162a show an irregular interdigitated relationship (not shown), where one N-type branched electrode 152a is alternated with one or more than one P-type branched electrode 162a. In the third embodiment, the trenches 18a and 18b have the outline of the N-type sub-electrode patterns 15a and 15b, respectively, but there is some space between the trench and the pattern to prevent electrical contact between the N-type sub-electrode patterns 15a, 15b and the transparent conductive oxide layer 14, the P-type semiconductor layer 13, the light-emitting layer 12. Other components in the third embodiment are the same with those in the first embodiment. Alternatively, the dielectric layer 17 of the second embodiment may be provided as a current blocking layer for the P-type electrode pattern layer 16. The dielectric layer 17 in this embodiment has the same position and shape as in the second embodiment, and therefore, the descriptions will not be repeated here.

Figure 6:
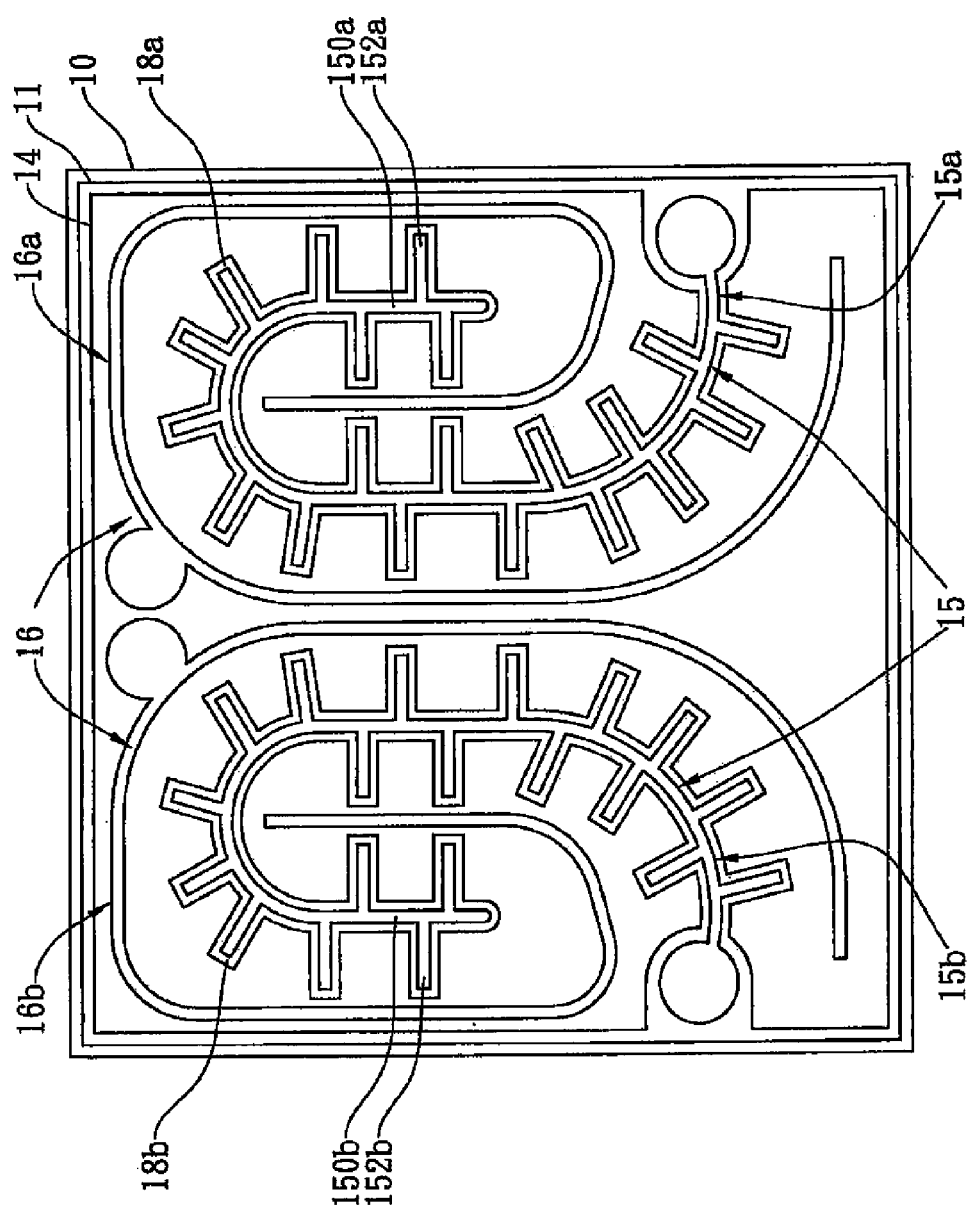
FIG. 6 is a schematic top view of a fourth embodiment of a light-emitting device.

FIG. 6 is a schematic top view of a fourth embodiment of a light-emitting device. The fourth embodiment is different from the first embodiment (see FIG. 2) in that in this embodiment, the P-type electrode pattern layer 16 does not have any branched electrodes, while the N-type electrode pattern layer 15 has the same shape as in the third embodiment (see FIG. 5). A plurality of N-type branched electrodes 152a and 152b are respectively formed on the N-type sub-electrode patterns 15a and 15b. Because of the electrode configuration of the N-type electrode pattern layer 15, there will be a highly non-uniform distance between the P-type electrode pattern layer 16 and the N-type electrode pattern layer 15. Moreover, various configurations of the P-type sub-electrode body 160b and the P-type branched electrode 162b thereupon, as illustrated in FIGS. 2B to 2F, can be applied to the N-type sub-electrode patterns 15a and 15b in the fourth embodiment as well. Other components in the fourth embodiment are the same with those in the first embodiment. Alternatively, the dielectric layer 17 of the second embodiment may be provided for the light-emitting device as a current blocking layer for the P-type electrode pattern layer 16. The dielectric layer 17 in this embodiment has the same position and shape as in the second embodiment, and therefore, it description will not to be repeated here.

The light-emitting device may be selected from a group consisting of: light-emitting diodes, light-emitting heterojunctions, light-emitting quantum wells, and other light-emitting solid-state devices. The light-emitting device may use any suitable material systems, such as II-VI and III-V material systems (e.g. III-nitride, III-phosphide, and III-arsenide material systems).

The various aspects of this disclosure are provided to enable one of ordinary skill in the art to practice the present invention. Various modifications to aspects presented throughout this disclosure will be readily apparent to those skilled in the art, and the concepts disclosed herein may be extended to other light sources regardless of the shape, application, or design constraints. Thus, the claims are not intended to be limited to the various aspects of this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A light-emitting device, comprising:
first and second semiconductor layers;
a light-emitting layer between the first and second semiconductor layers;
a first electrode pattern layer comprising a first electrode body deposited on the first semiconductor layer; and
a second electrode pattern layer deposited on the second semiconductor layer, the second electrode pattern layer comprising a second electrode body and a plurality of branched electrodes extending toward the first electrode body,
wherein a first distance between an end of a particular branched electrode of the second electrode pattern layer and the first electrode body is less than half of a distance between the first electrode body and the second electrode body, and
the branched electrodes extend substantially in parallel from the second electrode body with a slanting angle, wherein the slanting angle is an acute angle.

2. The light-emitting device of claim 1 wherein the first semiconductor layer comprises an N-type semiconductor layer and the first electrode pattern layer comprises an N-type electrode pattern, and wherein the second semiconductor layer comprises a P-type semiconductor layer and the second electrode pattern layer comprises a P-type electrode pattern.

3. The light-emitting device of claim 1 wherein the first semiconductor layer comprises a P-type semiconductor layer and the first electrode pattern layer comprises a P-type electrode pattern, and wherein the second semiconductor layer comprises an N-type semiconductor layer and the second electrode pattern layer comprises an N-type electrode pattern.

4. The light-emitting device of claim of claim 1 further comprising a substrate, wherein one of the first and second semiconductor layers is on the substrate, said one of the first and second semiconductor layers comprising an N-type semiconductor layer.

5. The light-emitting device of claim 1 wherein each of the first and second electrode pattern layers comprises a pair of sub-electrode patterns in a mirror relationship.

6. The light-emitting device of claim 1, wherein the plurality of branched electrodes of the second electrode pattern layer include a first branched electrode and a second branched electrode, a distance between an end of the first branched electrode and the first electrode body and a distance between an end of the second branched electrode and the first electrode body being different.

7. The light-emitting device of claim 1, wherein the plurality of branched electrodes of the second electrode pattern layer extend from the second electrode body with different intervals.

8. The light-emitting device of claim 1, wherein the plurality of branched electrodes of the second electrode pattern layer extend from the second electrode body with an interval that is smaller than the distance between the first and second electrode bodies.

9. The light-emitting device of claim 1, wherein the branched electrodes form slanting straight lines.

10. The light-emitting device of claim 1 further comprising a transparent conductive oxide layer on one of the first and second semiconductor layers, the transparent conductive oxide layer having a thickness of less than 1000 Angstroms.

11. The light-emitting device of claim 10 wherein the transparent conductive oxide layer comprises an ITO layer.

12. The light-emitting device of claim 10 further comprising a dielectric layer between the transparent conductive oxide layer and said one of the first and second semiconductor layers, the dielectric layer having the shape of the electrode pattern on said one of the first and second semiconductor layers but covering an area larger than that of the electrode pattern layer on said one of the first and second semiconductor layers.

13. The fight-emitting device of claim 1 wherein the first electrode pattern layer further comprises a plurality of branched electrodes extending toward the second electrode pattern layer, and
   wherein a third distance between an end of a particular branched electrode of the first electrode pattern layer and the second electrode body is less than half of the distance between the first and second electrode bodies.

14. The light-emitting device of claim 13, wherein the branched electrodes of the first and second electrode pattern layers have an interdigitated relationship.

15. The light-emitting device of claim 13, wherein the plurality of branched electrodes of the first electrode pattern layer include a third branched electrode and a fourth branched electrode, a distance between an end of the third branched electrode and the second electrode body and a distance between an end of the fourth branched electrode and the second electrode body being different.

16. The light-emitting device of claim 13, wherein the plurality of branched electrodes of the first electrode pattern layer extend from the first electrode body with different intervals.

17. The light-emitting device of claim 13, wherein the plurality of branched electrodes of the first electrode pattern layer extend from the first electrode body with an interval that is smaller than the distance between the first and second electrode bodies.

* * * * *